US007619464B2

(12) United States Patent
Choy et al.

(10) Patent No.: US 7,619,464 B2
(45) Date of Patent: Nov. 17, 2009

(54) CURRENT COMPARISON BASED VOLTAGE BIAS GENERATOR FOR ELECTRONIC DATA STORAGE DEVICES

(75) Inventors: Jon S. Choy, Austin, TX (US); Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 19 days.

(21) Appl. No.: 11/460,732

(22) Filed: Jul. 28, 2006

(65) Prior Publication Data

US 2008/0024204 A1 Jan. 31, 2008

(51) Int. Cl.
*G11C 11/4074* (2006.01)
*G11C 16/30* (2006.01)
*G05F 1/575* (2006.01)

(52) U.S. Cl. .................... 327/540; 327/54; 365/189.09; 365/228

(58) Field of Classification Search ....................... None
See application file for complete search history.

(56) References Cited

U.S. PATENT DOCUMENTS 5,953,256 A 9/1999 Briner ..................... 365/185.3
5,986,936 A * 11/1999 Ravazzini .............. 365/185.19
6,351,182 B1 * 2/2002 Drapkin et al. ............. 327/543
6,456,549 B1 * 9/2002 Sudo et al. .................. 365/207
6,781,888 B1 * 8/2004 Horch et al. ........... 365/189.09
6,788,601 B2 * 9/2004 Takano et al. ............... 365/207
6,836,443 B2 * 12/2004 Dadashev ................... 365/207
6,850,447 B2 * 2/2005 Kang ......................... 365/210
6,862,218 B2 * 3/2005 Guterman et al. ...... 365/185.24
7,020,036 B2 * 3/2006 Shen et al. .................. 365/210
7,170,790 B2 * 1/2007 Demange et al. ....... 365/185.21
7,173,401 B1 * 2/2007 Huang ........................ 323/277

* cited by examiner

*Primary Examiner*—Lincoln Donovan
*Assistant Examiner*—Terry L Englund
(74) *Attorney, Agent, or Firm*—Hamilton & Terrile, LLP; Kent B. Chambers

(57) ABSTRACT

An electronic data storage system uses current comparison to generate a voltage bias. In at least one embodiment, a voltage bias generator, that includes a current differential amplifier, generates a current that charges a load to a predetermined voltage bias level. The current comparison results in the comparison between two currents, $I_{ref}$ and $I_{saref}$. The current $I_{saref}$ can be generated using components that match components in the load and memory circuits in the system. In one embodiment, multiple sense amplifiers represent the load. By using matched components, as physical characteristics of the load and memory circuits change, the current $I_{saref}$ also changes. Thus, the voltage bias changes to match the changing characteristics of the load and memory circuits. The voltage bias generator can include a current booster that decreases the initial charging time of a reactive load.

27 Claims, 5 Drawing Sheets

–PRIOR ART–

CURRENT COMPARISON BASED VOLTAGE BIAS GENERATOR FOR ELECTRONIC DATA STORAGE DEVICES

BACKGROUND OF THE INVENTION

1. Field of the Invention

The present invention relates in general to the field of electronic data storage devices and more particularly to a voltage bias generator for generating a voltage bias based on current comparisons.

2. Description of the Related Art

Electronic data storage devices, such as flash memories, are found in a wide array of electronic devices. The storage devices store data in memory cells. Memory cells generally store data as a digital signal. In a binary storage system, memory cells store data as a logical "1" or a logical "0". A stable voltage bias reference allows accurate sensing of data content stored in the memory cells.

FIG. 1 depicts a conventional electronic data storage device 100 with a voltage bias generator 102. The voltage bias generator 102 generates a voltage bias $V_{ref}$ that serves as a reference voltage for sense amplifier 104. The electronic data storage device 100 also includes multiple memory cells 106 that store respective data in each memory cell. Sense amplifier 104 compares voltage bias $V_{ref}$ with the content of a memory cell to determine ("read") the data stored by the memory cell. For example, if the content of the memory cell is greater than the voltage bias $V_{ref}$, the memory cell stores a logical "1". Otherwise, the memory cell stores a logical "0". Thus, the voltage bias should be a known value to allow accurate reading of the memory cells.

To generate the voltage bias $V_{ref}$, the voltage bias generator 102 includes a diode connected field effect transistor (FET) 108 to generate a constant voltage $V_{GS}$. The value of $V_{GS}$ is determined by the drain current $I_{ref}$ and the physical properties of FET 108. A constant current source 110 generates drain current $I_{ref}$. The FET 108 applies the voltage $V_{GS}$ to the non-inverting input terminal of an operational amplifier (OPAMP) 112. OPAMP 112 serves as a buffer, and the non-inverting input of OPAMP 112 provides a high output impedance to FET 108. To maintain a constant voltage bias $V_{ref}$ for sensing amplifier 104, OPAMP 112 is configured with unity feedback to the inverting terminal.

The voltage bias generator 102 works well in some applications. However, if the load has a significant reactive component and draws current, OPAMP 112 can exhibit performance impacting latency when charging the load to the voltage bias $V_{ref}$. Additionally, OPAMP 112 includes an offset voltage $V_{offset}$. Thus, the voltage bias $V_{ref}$ does not equal $V_{GS}$. The voltage bias $V_{ref}$ actually equals $V_{GS}-V_{offset}$. Accurately predicting and replicating an exact value for the offset voltage $V_{offset}$ is difficult and causes the sense amplifier 104 to have a wider margin between the voltage bias reference $V_{ref}$ and the data contents of the memory cells 106. Additionally, as components age and are affected by environmental and use characteristics, component values may drift. Drifting of component values can cause error in the reading of memory cells 106, or the error is compensated through additional error margins added to the voltage bias $V_{ref}$ and/or the sense amplifier 104.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An electronic data storage system uses current comparison to generate a voltage bias. In at least one embodiment, a voltage bias generator, that includes a current differential amplifier, generates a current that charges a load to a predetermined voltage bias level. The current comparison results in the comparison between two currents, $I_{ref}$ and $I_{saref}$. The current $I_{saref}$ can be generated using components that match components in the load and memory circuits in the system. The current $I_{ref}$ is generated using a constant current source 210. In one embodiment, multiple sense amplifiers represent the load. By using matched components, as physical characteristics of the load and memory circuits change, the current $I_{saref}$ also changes. Thus, the voltage bias changes to match the changing characteristics of the load and memory circuits. Additionally, in at least one embodiment, current comparison allows the voltage bias generator to quickly charge reactive loads relative to the time used by a conventional voltage bias generator. In at least one embodiment, the voltage bias generator includes a current booster that decreases the initial charging time of a reactive load.

Figure 1:
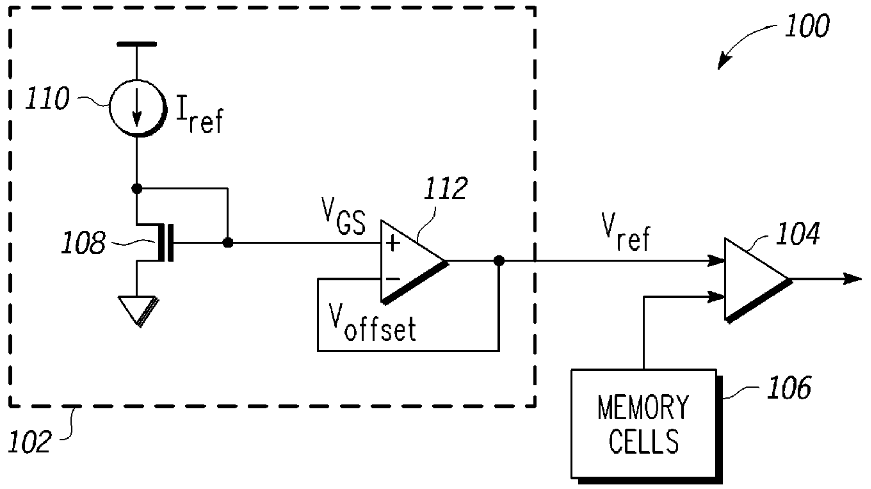
FIG. 1 (labeled prior art) depicts an electronic data storage device with a voltage bias generator.
Figure 2:
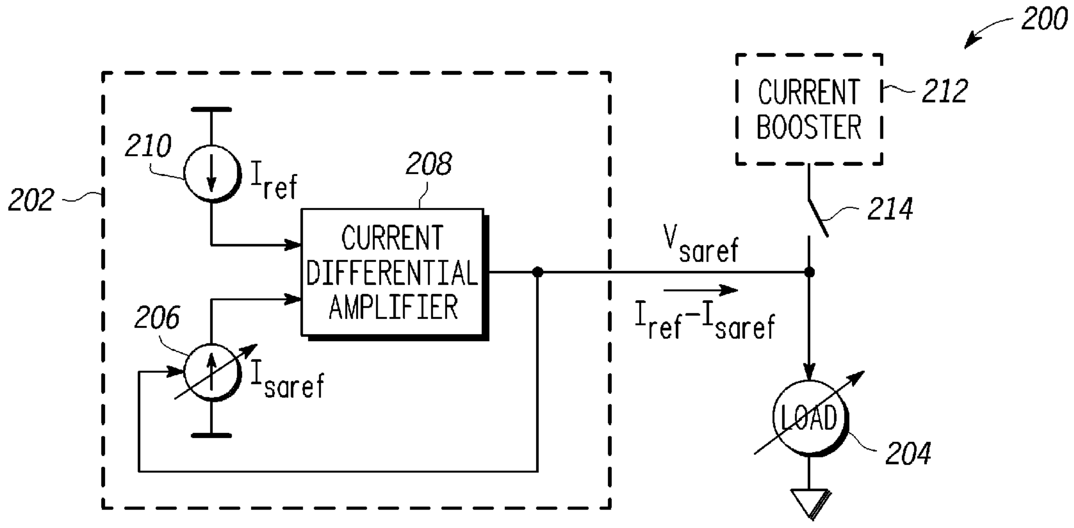
FIG. 2 depicts an electronic data storage system that includes a current comparison, voltage bias generator.

FIG. 2 depicts an embodiment of an electronic data storage system 200 that includes a current comparison, voltage bias generator 202. The voltage bias generator 202 generates a voltage bias $V_{saref}$ that provides a reference voltage to load 204. The voltage bias generator 202 generates voltage bias $V_{saref}$ by comparing current $I_{ref}$ with current $I_{saref}$ and providing an output current $_{ref}-I_{saref}$. When the load 204 is drawing no current, electronic data storage system 200 is in equilibrium and $I_{ref}=I_{saref}$. However, if the load begins to draw current, the voltage bias $V_{saref}$ will initially decrease. When voltage bias $V_{saref}$ decreases, current $I_{saref}$ decreases, which causes the current differential amplifier 208 to provide an output current equal to $I_{ref}-I_{saref}$. The current $I_{ref}-I_{saref}$ drives the output voltage $V_{saref}$ up until $I_{ref}=I_{saref}$.

Figure 3:
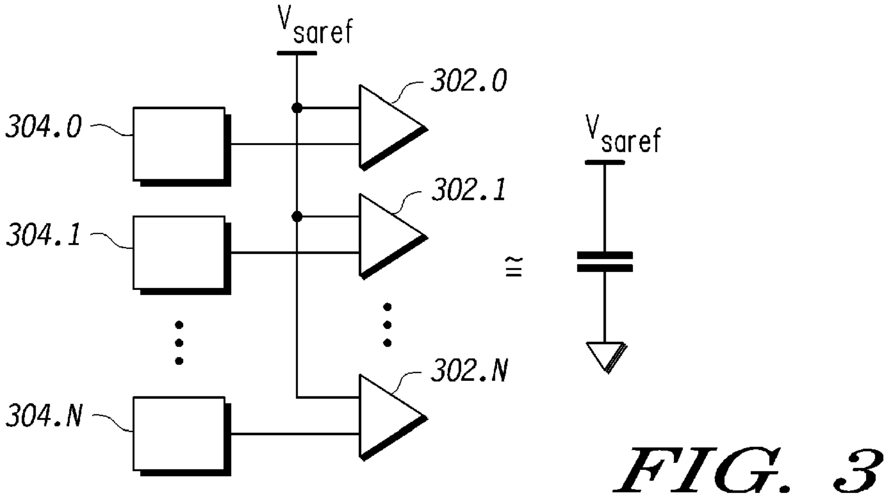
FIG. 3 depicts an array of memory cells and sense amplifiers.

Referring to FIGS. 2 and 3, in at least one embodiment, the current generator 206 includes components that match components of the load 204. FIG. 3 depicts an array of sense amplifiers and memory cells. As depicted in FIG. 3, in at least one embodiment, the combined input impedances of N+1 sense amplifiers 302.0, 302.1, . . . , 302.N represent load 204, where N is a positive integer. Thus, in at least one embodiment, current generator 206 is constructed using components that match the characteristics of sense amplifiers 302.0, 302.1, 302.N. By matching the characteristics of the sense amplifiers 302.0, 302.1, . . . , 302.N, current $I_{saref}$ follows changes in the load, and voltage bias generator 202 adjusts the value of voltage bias $V_{saref}$ to, for example, maintain design margins between the value of voltage bias $V_{saref}$ and data contents of memory cells 304.0, 304.1, . . . , 304.N.

In at least one embodiment, the input impedance of the sense amplifiers 302.0, 302.1, . . . , 302.N can be modeled as a capacitor. The number of sense amplifiers can be on the order of thousands or more, and, thus, the capacitive input impedance of the 302.0, 302.1, . . . , 302.N can be very large, such as 200 pF. The current differential amplifier 208 can react to changes in the load 204 and power consumption by the load 204 more quickly while remaining stable.

In at least one embodiment, the voltage bias generator 202 includes a current booster 212. During certain operational phases, load 204 can draw more current than during other times. For example, during initialization of electronic data storage system 200, the load 204 is initially uncharged. The current differential amplifier 208 sources current to load 204 to raise the voltage bias to $V_{saref}$. Activating switch 214 provides a boost current $i_B$ from current booster 212 to augment the current sourced by differential amplifier 208. The additional boost current decreases the charging time of load 204, and, thus, initializes the electronic data storage system 200 to operational readiness more quickly than with the current differential amplifier 208 alone. The duration and level of the boost current $i_B$ depend on the particular load and particular components of electronic data storage system 200. In at least one embodiment, the boost current $i_B$ multiplies the difference current ($I_{ref-Isaref}$) by a factor n=2.

Figure 4:
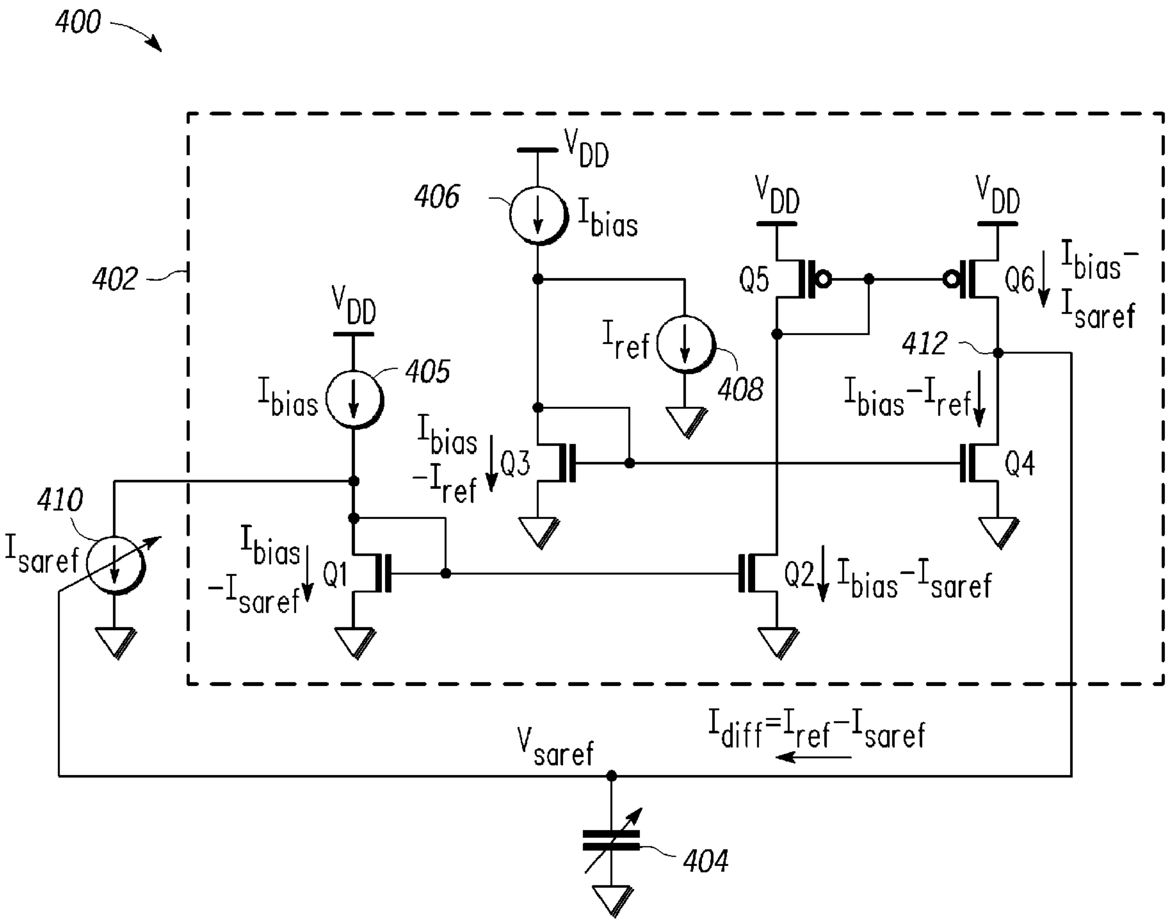
FIG. 4 depicts a voltage bias generator with current comparison.

FIG. 4 depicts voltage bias generator 400, which represents one embodiment of voltage bias generator 202. The voltage bias generator 400 includes a current differential amplifier 402 to compare two currents and generate a difference current $I_{diff}=I_{ref}-I_{saref}$. The difference current $I_{diff}$ charges load 404 to a predetermined voltage bias $V_{saref}$.

The voltage bias generator 400 uses current generators, current mirrors, and feedback to establish and maintain the voltage bias $V_{saref}$. Current generators 405 and 406 provide a bias current $I_{bias}$ to bias diode configured FETs Q1 and Q3. Current generator 408 generates a reference current $I_{ref}$. The reference current $I_{ref}$ represents one component of the difference current $I_{diff}$ that is used to set the level of voltage bias $V_{saref}$. Current generator 410 generates reference current $I_{saref}$, which represents the other component of the difference current $I_{diff}$. Changes in current draw by load 404 are reflected in the level of voltage bias $V_{saref}$. Voltage bias $V_{saref}$ is used as a feedback signal to current generator 410 to adjust the value of reference current $I_{saref}$ so that current differential amplifier 402 restores voltage bias $V_{saref}$ to a predetermined value.

In at least one embodiment, the value of voltage bias $V_{saref}$ is predetermined but not necessarily constant over time. As load 404 ages, endures increased hours of usage, and is subject to environmental stresses, such as temperature changes, the electrical characteristics of load 404 change. Accordingly, in at least one embodiment, voltage bias generator 400 is designed to adjust voltage bias $V_{saref}$ accordingly. Thus, the predetermined value of voltage bias $V_{saref}$ is relative to the electrical characteristics of, for example, load 404.

To accommodate changing electrical characteristics in load 404, in at least one embodiment, the components of current generator 410 have electrical characteristics that match the electrical characteristics of load 404 over time. Thus, voltage bias generator 400 can be designed with margins of error that do not have to account for any or at least significant changes in electrical characteristics of load 404 over time.

N-channel MOSFETs Q1 and Q2 are configured in a current mirror arrangement. Thus, the drain current Id2 of FET Q2 mirrors the drain current Id1 of FET Q1. In at least one embodiment, FETs Q1 and Q2 are substantially identical so that the Id1=Id2=$I_{bias}-I_{saref}$. N-channel FETs Q3 and Q4 are also configured in a current mirror arrangement. Thus, the drain current Id4 of FET Q4 mirrors the drain current Id3 of Q3. In at least one embodiment, FETs Q3 and Q4 are substantially identical so that the Id3=Id4=$I_{bias}-I_{ref}$. P-channel MOSFETs Q5 and Q6 are also configured in a current mirror arrangement. Thus, the drain current Id6 of FET Q6 mirrors the drain current Id5 of FET Q5. FETs Q5 and Q2 are arranged in series, so Id5=Id2. In at least one embodiment, FETs Q1 and Q2 are substantially identical so that the Id2=Id5=Id6=$I_{bias}-I_{saref}$. In one embodiment, bias current $I_{bias}$=20 μA, reference current $I_{ref}$=10 μA, and load 404 is modeled as a 200 pF capacitance whose exact value can vary over time.

The current differential amplifier 402 generates the difference current $I_{diff}$ at node 412. The difference current $I_{diff}=(I_{bias}-I_{saref})-(I_{bias}-I_{ref})=I_{ref}-I_{saref}$. When voltage bias generator 400 is in equilibrium, i.e. load 404 draws no current, $I_{ref}=I_{saref}$ and voltage bias $V_{saref}$ has the predetermined level. If load 404 draws (sinks) current, the current differential amplifier 402 responds by decreasing current reference $I_{saref}$ and, thus, increasing the difference current $I_{diff}$. As difference current $I_{diff}$ increases, the voltage bias $V_{saref}$ increases. Increasing voltage bias $V_{saref}$ causes reference current $I_{saref}$ to increase until reference current $I_{saref}=I_{ref}$. When current $I_{saref}=I_{ref}$, the current differential amplifier 402 is again at equilibrium.

Figure 5:
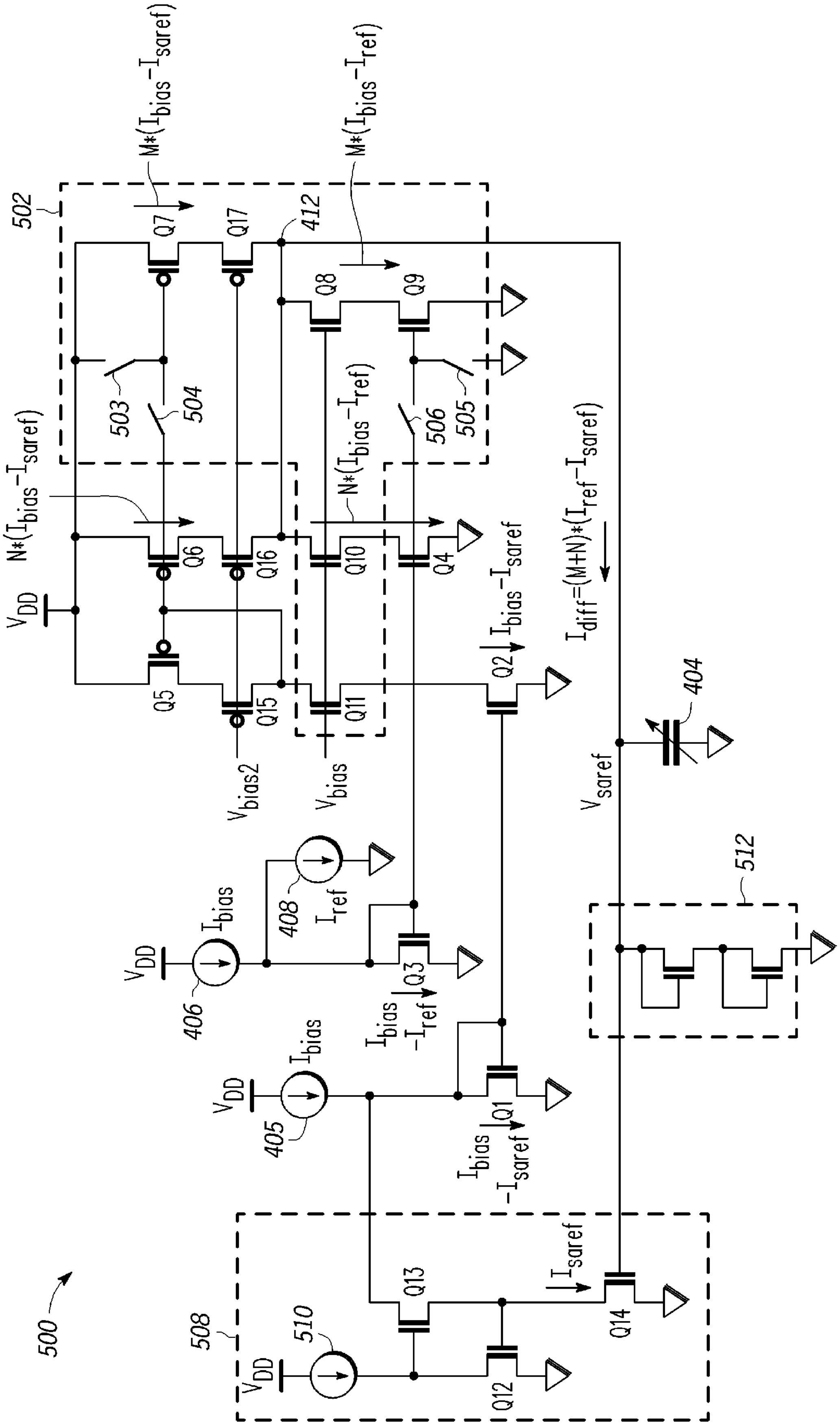
FIG. 5 depicts a voltage bias generator with current comparison and a current booster.

FIG. 5 depicts voltage bias generator 500, which represents another embodiment of voltage bias generator 202 with a current booster 502. Current booster 502 is activated to boost the difference current $I_{diff}$ by a factor of (M+N) so that different current $I_{diff}$ equals $(M+N)\times(I_{ref}-I_{saref})$. Boosting the difference current $I_{diff}$ allows voltage bias generator 500 to, for example, charge load 404 more quickly. In one embodiment, (M+N) equals two (2). Current booster 502 is activated (i.e. turned 'on') and deactivated (i.e. turned 'off') by controlling the conductivity of switches 503, 504, 505, and 506. Current booster 502 is turned 'off' by causing switch 503 to conduct and drive the gate of FET Q7 to VDD, causing switch 505 to conduct and drive the gate of FET Q9 to ground, and causing switches 504 and 506 to not conduct. The current booster 502 can be turned 'off' to, for example, conserve power. Current booster 502 is turned 'on' by causing switches 503 and 505 to not conduct and causing switches 504 and 506 to conduct. When switch 504 conducts, FET Q7 also conducts. When switch 506 conducts, FET Q9 also conducts.

P-channel MOSFETs Q5, Q6, and Q7 are configured in a current mirror arrangement. Thus, the drain currents Id6 and Id7 of respective FETs Q6 and Q7 mirror the drain current Id5 of FET Q5. The drain current Id6 is multiplied by a factor N, and the drain current Id7 is multiplied by a factor M. Thus, the current entering node 412 equals Id6+Id7=(M+N)×Id5=$(M+N)\times(I_{bias}-I_{saref})$. In at least one embodiment, FETs Q5, Q6, and Q7 are substantially identical, and the current entering node 412 equals $2\times(I_{bias}-I_{ref})$. By altering the widths and lengths of FET Q7, the multiplying factors M and N can be pre-determined to be any number.

N-channel FETs Q3, Q4, and Q9 are configured in a current mirror arrangement. Thus, the drain currents Id4 and Id9 of respective FETs Q4 and Q9 mirror the drain current Id3 of FET Q3. The drain current Id4 is multiplied by the factor N, and the drain current Id9 is multiplied by the factor M. Thus, the current exiting node 412 through FETs Q4 and Q9 equals Id4+Id9=(M+N)×Id3=$(M+N)\times(I_{bias}-I_{ref})$. In at least one embodiment, FETs Q3, Q4 and Q9 are substantially identical, and the current exiting node 412 through FETs Q4 and Q9 equals $2\times(I_{bias}-I_{ref})$. By altering the widths and lengths of FET Q9, the multiplying factors M and N can be changed. Thus, the difference current $I_{diff}=(M+N)\times(I_{ref}-I_{saref})$. N-channel FET's Q8, Q10, and Q11 clamp the drain to source voltage Vds of the mirroring FET's Q9, Q4, and Q2, respectively, to allow FET's Q9 and Q4 Q2 to act as ideal mirroring devices. Similarly the P-channel FET's Q15, Q16, and Q17 allow FET's Q6 and Q7 to act as ideal mirroring devices by matching the drain to source voltages Vds of the mirroring FET's Q5, Q6, and Q7.

Reference current source 508 represents one embodiment of reference current source 410. Reference current source 508 generates the reference current $I_{saref}$, which is responsive to changes in the voltage bias $V_{saref}$. The drain current Id12 of FET Q12 is constant and set by current generator 510. In one embodiment, drain current Id12=$I_{Ref}$=5 μA. The voltage bias $V_{saref}$ sets the gate to source voltage $V_{GS}$ 14 of FET Q14, which causes FET Q14 to conduct a drain current = reference current $I_{saref}$. As voltage bias $V_{saref}$ decreases, $V_{GS}$14 decreases, which lowers reference current $I_{saref}$. As voltage bias $V_{saref}$ increases, $V_{GS}$14 increases, which increases reference current $I_{saref}$. The steady state value of reference current $I_{saref}$ is determined by reference current $I_{ref}$ as the closed loop system forces reference current $I_{saref}$ to equal reference current $I_{ref}$ through negative feedback of the voltage bias $V_{saref}$ bias. In at least one embodiment, FET's Q12, Q13, & Q14 match the current comparator devices used in a sense amplifier (such as sense amplifier 404A of FIG. 6) to sense the value of a memory cell. Voltage bias generator 500 also includes a voltage clamp 512.

The FETs Q12, Q13, and Q14 are designed with electrical characteristics that match changes in the electrical characteristics of load 404. In at least one embodiment, load 404 represents the input impedance of sense amplifiers 302.0, 302.1, . . . , 302.N. In at least one embodiment, all transistors in voltage bias generator 400 and voltage bias generator 500 are complimentary metal oxide field effect transistors. Other transistor technologies can also be used. Additionally, in at least one embodiment, no flash memory FETs are used, so there is no need to "program" the FETs.

Figure 6:
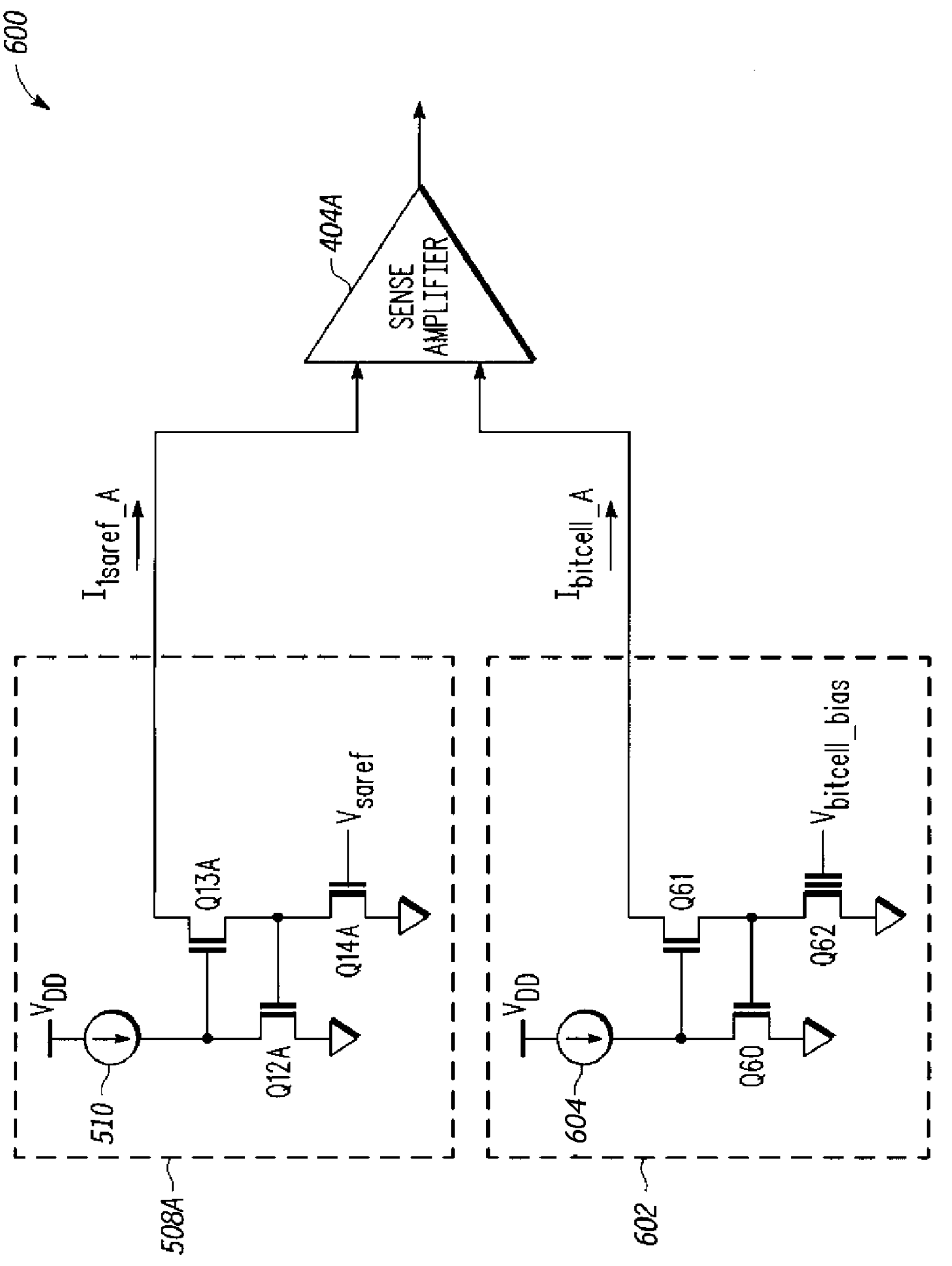
FIG. 6 depicts a memory circuit.

FIG. 6 depicts one embodiment of a memory circuit 600. Referring to FIGS. 5 and 6, in at least one embodiment, the memory circuit 600 is incorporated into an integrated circuit with voltage bias generator 500 and is replicated thousands of times, tens of thousands of times, or more. In at least one embodiment, local reference current source 508A is fabricated using the same design specifications as reference current source 508. Thus, FETs Q12A, Q13A, and Q14A are identical or at least substantially identical to FETs Q12, Q13, and Q14. In at least one embodiment, exact matching of FET Q14 and Q14A is preferable.

Local reference current source 508A generates a local sense amp reference current $I_{saref\_A}$ proportional to voltage bias $V_{saref}$ generated by voltage bias generator 500. As the electrical characteristics of local reference current source 508A change over time, a parallel change occurs in the electrical characteristics of reference current source 508. Thus, changes in voltage bias $V_{saref}$ due to changing electrical characteristics of reference current source 508 directly track changes in local sense amp reference current $I_{saref\_A}$ to due changing electrical characteristics of local reference current source 508A.

Memory circuit 600 includes a memory cell 602 to store one bit of data and generate a bit cell current $I_{bitcell\_A}$ representative of the value of the bit. The memory cell 602 includes a floating gate FET Q62 to store data. A bit cell bias voltage $V_{bitcell\_bias}$ charges and discharges the floating gate to store data in FET Q62. Thus, the conductivity of FET Q62 determines the value of the data stored in FET Q62. The memory cell 602 also includes FETs Q60 and Q61 and reference current source 604 to generate the bit cell current $I_{bitcell\_A}$ in accordance with the data value stored by FET Q62. In at least one embodiment, FETs Q60 and Q61 also match FETs Q12 and Q13 so that changes in FETs Q12 and Q13 that affect the value of bit cell current $I_{bitcell\_A}$ are matched by changes in local sense amp reference current $I_{1saref\_A}$ and sense amp reference current $I_{saref}$.

The local reference current source 508A provides local sense amp reference current $I_{Isaref\_A}$ to an input of sense amplifier 404A, and memory cell 602 provides the bit cell current $I_{bitcell\_A}$. Sense amplifier 404A compares the values of local sense amp reference current $I_{Isaref\_A}$ and bit cell current $I_{bitcell\_A}$ to determine the value of the data stored by FET Q62.

The input capacitance of sense amplifier 404A represents a fraction of the capacitive load 404. In at least one embodiment, the total capacitive load equals the sum of input capacitance loading of sense amplifiers for all memory circuits connected to voltage bias generator 500 and, preferably to a much lesser degree, parasitic line capacitance.

Figure 7:
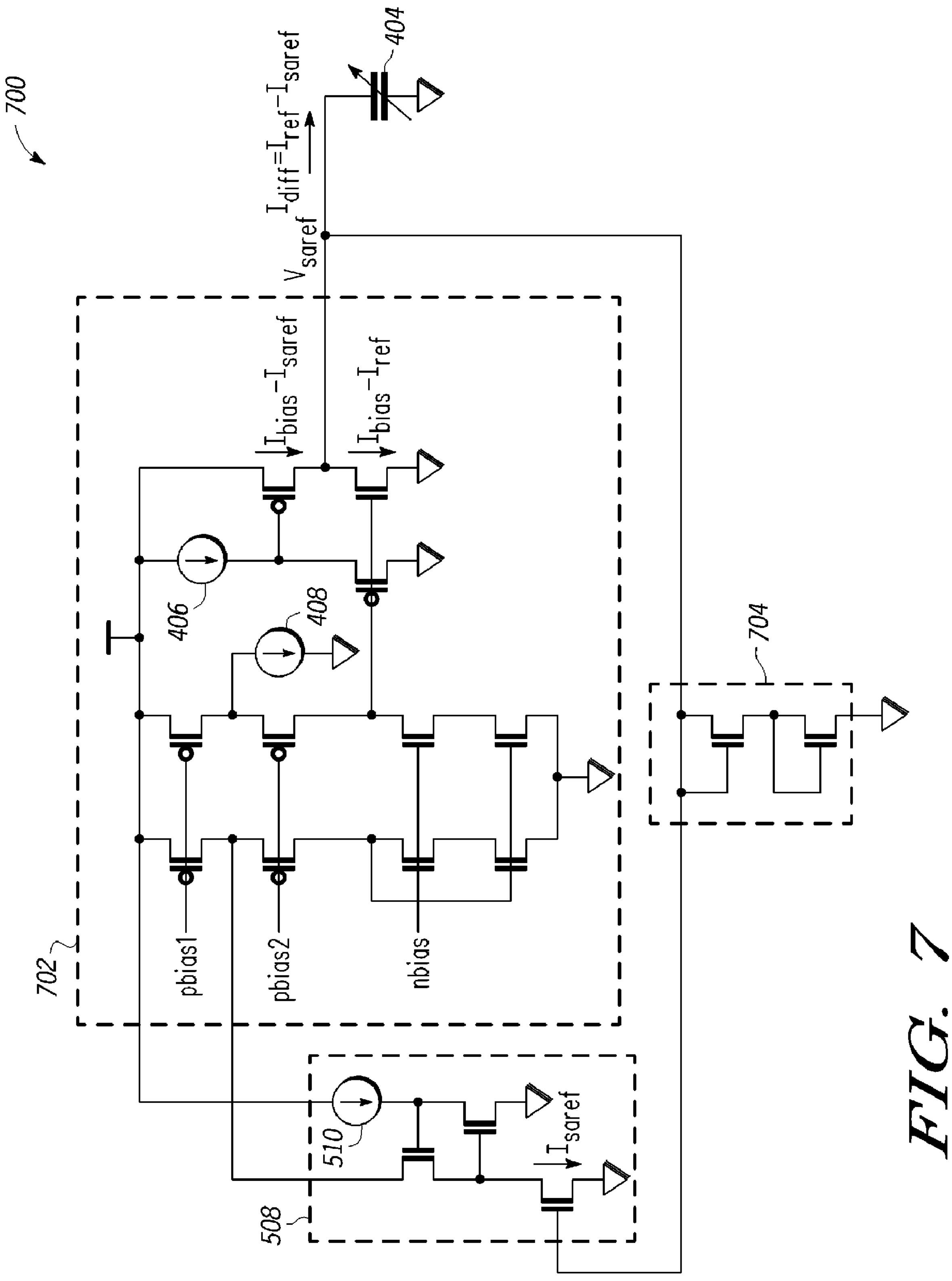
FIG. 7 depicts a voltage bias generator with current comparison.

FIG. 7 depicts a voltage bias generator 700, which represents another embodiment of voltage bias generator 202. The voltage bias generator 700 includes a current differential amplifier 702 that generates the difference current $I_{diff}$=$I_{ref}$−$I_{saref}$. Voltage bias generator 704 also includes a voltage clamp 704.

Thus, the electronic data storage system 200 with voltage bias generator 202 uses current comparison to generate a voltage bias that is responsive to variable load and memory cell conditions.

Although the present invention has been described in detail, it should be understood that various changes, substitutions and alterations can be made hereto without departing from the spirit and scope of the invention as defined by the appended claims.

What is claimed is:

1. A system comprising:

a voltage bias generator to generate a voltage bias for a load from a comparison between a first current and a second current, wherein the voltage bias generator further comprises:

a feedback path to receive a feedback signal to alter the first current based on a value of the feedback signal; and a current booster to supply boost current to the load to decrease an amount of time for the load to reach a predetermined voltage bias level.

2. The system of claim 1 wherein the load comprises a plurality of sense amplifiers coupled to the voltage bias generator, the system further comprising:

a plurality of memory cells coupled to the sense amplifiers.

3. The system of claim 1 wherein the load comprises sense amplifier components and the voltage bias generator further comprises:

a current differential amplifier to compare the first current to the second current and to generate a difference current, wherein the difference current comprises a reference current minus a sense amplifier reference current, wherein during operation of the system the sense amplifier reference current varies in accordance with changes in components that model the sense amplifier components of the load.

4. The system of claim 2 wherein the voltage bias generator further comprises:

a sense amplifier model circuit to generate a current component of the first current, wherein components of the sense amplifier model circuit track one or more change in electrical properties of the sense amplifiers due to environmental changes.

5. The system of claim 1 wherein the load includes a reactive impedance.

6. The system of claim 5 further comprising:

one or more switches coupled to the current booster to stop and start the supply of the boost current to the load.

7. The system of claim 1 wherein the feedback signal comprises the voltage bias.

8. The system of claim 2 wherein the memory cells comprise flash memory cells.

9. An electronic data storage system comprising:

a load;

a first current generator to generate a first current;

a second current generator to generate a second current;

a current differential amplifier, coupled to the load and the first and second current generators, to compare the first current and the second current and to generate an output current to charge the load to a predetermined voltage reference bias;

a feedback path coupled to the first current generator to supply a feedback signal to the first current generator to alter the first current based on a value of the feedback signal;

a current boost source; and a switch coupled between the current boost source and the second current generator.

10. The electronic data storage system of claim 9 wherein the feedback signal comprises the voltage reference bias.

11. The electronic data storage system of claim 9 wherein the first current generator comprises a sense amplifier model circuit, wherein components of the sense amplifier model circuit track one or more changes in electrical properties of sense amplifiers in the load due to environmental changes.

12. The electronic data storage system of claim 9 wherein the load comprises a plurality of sense amplifiers, the electronic data storage system further comprising:

a plurality of memory cells, each coupled to a respective one of the sense amplifiers.

13. The electronic data storage system of claim 12 wherein the memory cells comprise flash memory cells.

14. A method of generating a voltage reference bias in an electronic data storage system, the method comprising:

generating a first current reference signal;

generating a second current reference signal;

charging a load to a predetermined level of the voltage reference bias using a difference between the first current reference signal and the second current reference signal; and boosting the second current reference signal by a factor of N, wherein N is a real number greater than one (1).

15. The method of claim 14 wherein the load includes a plurality of sense amplifiers, wherein generating the first current reference signal comprises:

generating a sense amplifier reference current that varies in accordance with changes in modeled sense amplifier components.

16. The method of claim 15 further comprising:

responding to changes in the sense amplifier reference current to maintain the predetermined voltage reference level.

17. The method of claim 14 wherein boosting the second current reference signal by a factor of N further comprises:

during initialization of the electronic data storage system, boosting the second current reference signal by the factor of N, wherein N is a real number greater than one (1).

18. The method of claim 14 wherein the charging a load to a predetermined voltage reference level further comprises:

charging a plurality of input terminals of respective sense amplifiers to the predetermined voltage reference level.

19. The method of claim 14 further comprising:

receiving a feedback signal to alter the first current reference signal based on a value of the feedback signal.

20. An electronic data storage system comprising:

a voltage bias generator to generate a voltage bias for a load from a comparison between a first current and a second current, wherein the voltage bias generator further comprises a feedback path to receive a feedback signal to alter the first current based on a value of the feedback signal and the second current is generated by a constant current source during operation of the electronic data storage system wherein the load includes a reactive impedance and the voltage bias generator further comprises a current booster to supply boost current to the load to decrease an amount of time for the load to reach a predetermined voltage bias level.

21. The electronic data storage system of claim 20 wherein the load comprises a plurality of sense amplifiers coupled to the voltage bias generator, the electronic data storage system further comprising:

a plurality of memory cells coupled to the sense amplifiers.

22. The electronic data storage system of claim 21 wherein the voltage bias generator further comprises:

a sense amplifier model circuit to generate a current component of the first current, wherein components of the sense amplifier model circuit track one or more changes in electrical properties of the sense amplifiers due to environmental changes.

23. The electronic data storage system of claim 21 wherein the memory cells comprise flash memory cells.

24. The electronic data storage system of claim 20 wherein the load comprises sense amplifier components and the voltage bias generator further comprises:

a current differential amplifier to compare the first current to the second current and to generate a difference current, wherein the difference current comprises a reference current minus a sense amplifier reference current, wherein during operation of the electronic data storage system the sense amplifier reference current varies in accordance with changes in components that model the sense amplifier components of the load.

25. The electronic data storage system of claim 20 further comprising:

one or more switches coupled to the current booster to stop and start the supply of the boost current to the load.

26. An electronic data storage system comprising:

a voltage bias generator to generate a voltage bias for a load from a comparison between a first current and a second current, wherein:

the voltage bias generator further comprises a feedback path to receive a feedback signal to alter the first current based on a value of the feedback signal and the second current is generated by a constant current source during operation of the electronic data storage system;

the load comprises a plurality of sense amplifiers coupled to the voltage bias generator; and the voltage bias generator further comprises a sense amplifier model circuit to generate a current component of the first current, wherein components of the sense amplifier model circuit track one or more changes in electrical properties of the sense amplifiers due to environmental changes; and a plurality of memory cells coupled to the sense amplifiers.

27. An electronic data storage system comprising:

a voltage bias generator to generate a voltage bias for a load from a comparison between a first current and a second current, wherein:

the voltage bias generator further comprises a feedback path to receive a feedback signal to alter the first current based on a value of the feedback signal and the second current is generated by a constant current source during operation of the electronic data storage system;

the load comprises sense amplifier components; and the voltage bias generator further comprises a current differential amplifier to compare the first current to the second current and to generate a difference current, wherein the difference current comprises a reference current minus a sense amplifier reference current, wherein during operation of the electronic data storage system the sense amplifier reference current varies in accordance with changes in components that model the sense amplifier components of the load.

* * * * *